(12) United States Patent
Miyake

(10) Patent No.: US 7,481,353 B2
(45) Date of Patent: Jan. 27, 2009

(54) METAL BONDING METHOD

(75) Inventor: Toshihiro Miyake, Inuyama (JP)

(73) Assignee: Denso Corporation, Kariya (JP)

( * ) Notice: Subject to any disclaimer, the term of this patent is extended or adjusted under 35 U.S.C. 154(b) by 664 days.

(21) Appl. No.: 11/197,330

(22) Filed: Aug. 4, 2005

(65) Prior Publication Data

US 2006/0027633 A1 Feb. 9, 2006

(30) Foreign Application Priority Data

Aug. 4, 2004 (JP) ............................. 2004-228408
May 10, 2005 (JP) ............................. 2005-137685

(51) Int. Cl.
*B23K 31/02* (2006.01)

(52) U.S. Cl. ....................... 228/223; 228/224; 228/214; 228/207; 148/23; 148/24; 148/25

(58) Field of Classification Search ................. 228/223, 228/224, 214, 207; 148/23, 24, 25
See application file for complete search history.

(56) References Cited

U.S. PATENT DOCUMENTS

| 3,040,781 | A | * | 6/1962 | Reymann et al. ............ 138/145 |
| 4,615,479 | A | * | 10/1986 | Ohotoshi et al. .......... 228/180.1 |
| 6,598,780 | B2 | | 7/2003 | Miyake et al. |
| 6,601,754 | B2 | | 8/2003 | Miyake et al. |
| 6,719,187 | B2 | | 4/2004 | Miyake et al. |
| 6,769,598 | B2 | | 8/2004 | Miyake et al. |
| 2003/0104303 | A1 | * | 6/2003 | Mahabadi et al. ...... 430/111.32 |
| 2004/0213994 | A1 | * | 10/2004 | Kozakai et al. ............. 428/354 |

* cited by examiner

*Primary Examiner*—Kiley Stoner
*Assistant Examiner*—Erin B Saad
(74) *Attorney, Agent, or Firm*—Harness, Dickey & Pierce, PLC

(57) ABSTRACT

A hydrocarbon compound mixed with an organic peroxide is placed between a copper electrode and a solder-coated electrode, and is heated at a temperature of about 300° C. The organic peroxide is exposed to a heating energy and thermally decomposed into an organic peroxide radical whose oxygen-oxygen bond has been released. Since this organic peroxide radical is active, it abstracts hydrogen from the hydrocarbon compound. The formation of a hydrocarbon compound radical is accelerated by the organic peroxide so that even at a relatively low heating temperature, a sufficient amount of a hydrocarbon compound radical can be formed. As a result, an oxide film can be removed from the metal surface even at a relatively low heating temperature by the reduction caused by a hydrocarbon compound radical.

11 Claims, 5 Drawing Sheets

FIG. 4
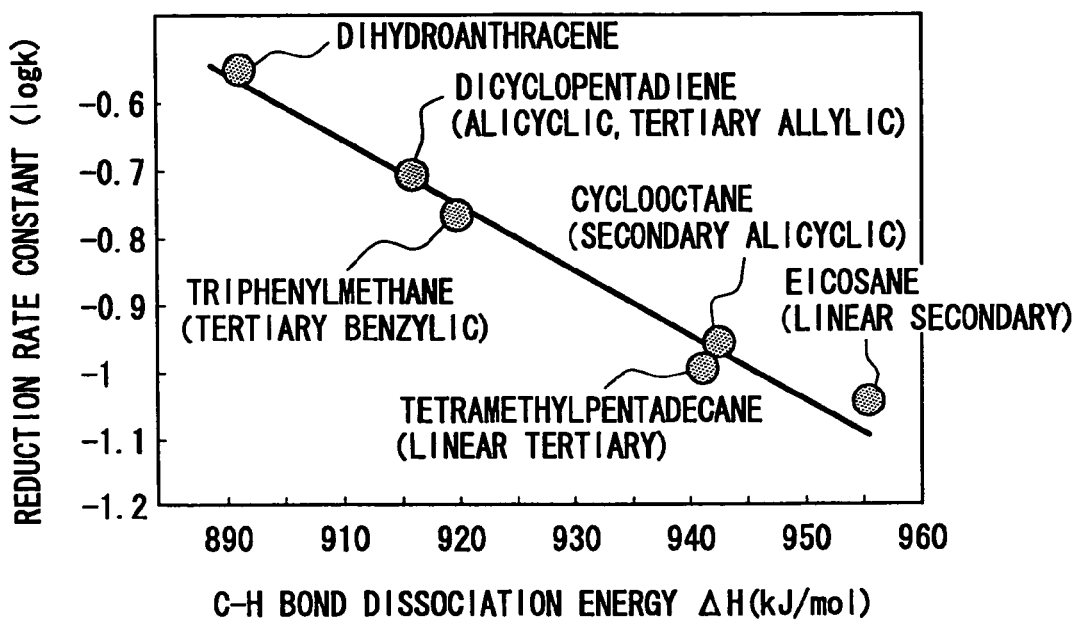
FIG. 5A
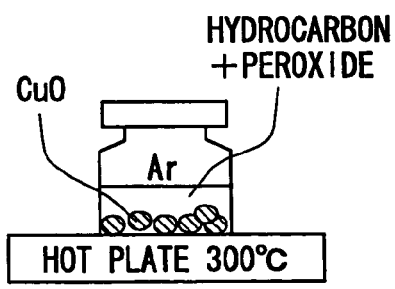
FIG. 5B
FORMATION AMOUNT OF HYDROCARBON OXIDE
(METHYL ETHYL KETONE PEROXIDE)
| COMPOSITION BEFORE HEATING | HYDROCARBON OXIDE (AFTER HEATING) |
|---|---|
| ONLY HYDROCARBON | 4.57% |
| HYDROCARBON+CuO | 5.24% |
| HYDROCARBON+ PEROXIDE+CuO | 5.63% |
INCREASE

FIG. 6
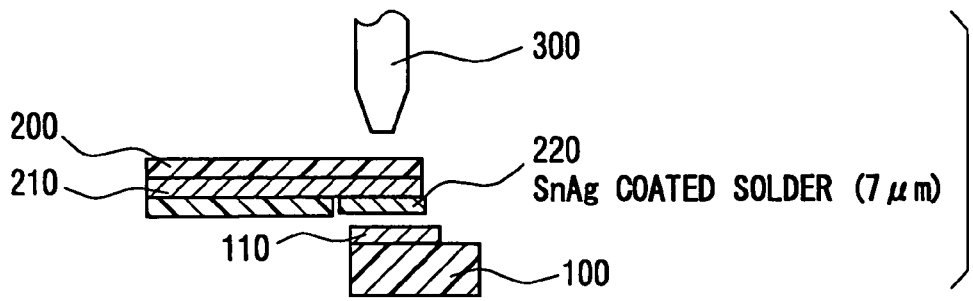
FIG. 7
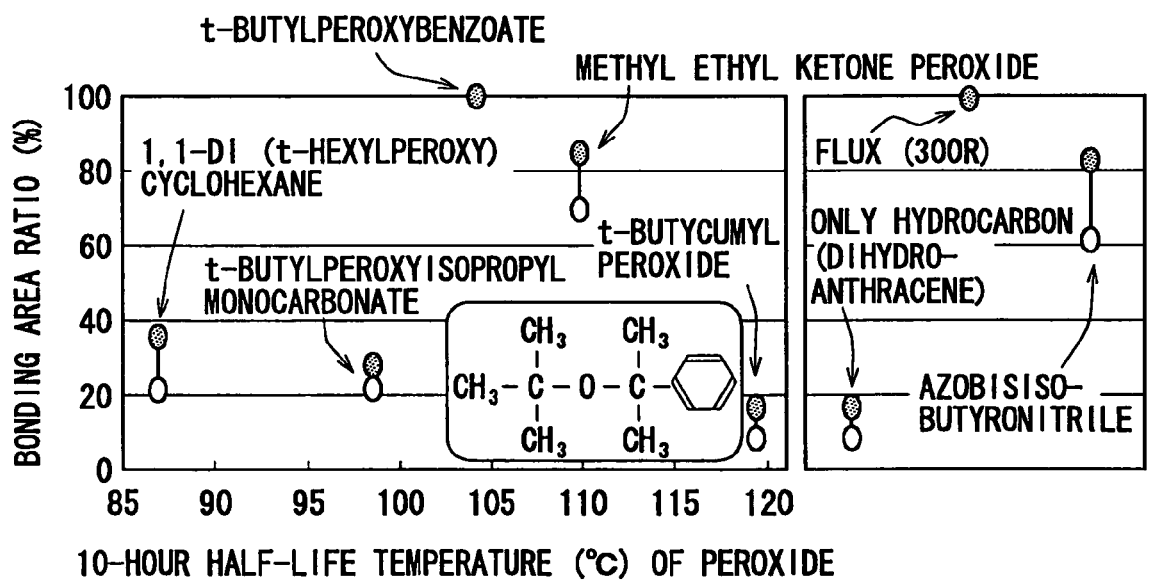
FIG. 8
| HYDROCARBON | PEROXIDE | BONDING AREA (%) |
|---|---|---|
| DIHYDROANTHRACENE 1% | NONE | 15 |
| DIHYDROANTHRACENE 5% | NONE | 15 |
| DIHYDROANTHRACENE 5% | METHYL ETHYL KETONE PEROXIDE 5% | 70 |
| DIHYDROANTHRACENE 5% | METHYL ETHYL KETONE PEROXIDE 10% | 90 |
| DIHYDROANTHRACENE 10% | METHYL ETHYL KETONE PEROXIDE 10% | 95 |
| NONE | METHYL ETHYL KETONE PEROXIDE 10% | 15 |

US 7,481,353 B2

METAL BONDING METHOD

CROSS REFERENCE TO RELATED APPLICATION

This application is based on Japanese Patent Applications No. 2004-228408 filed on. Aug. 4, 2004 and No. 2005-137685 filed on May 10, 2005, the contents of which are incorporated herein by reference in its entirety.

FIELD OF THE INVENTION

The present invention relates to a metal bonding method, for example, a method for bonding metal connectors of wirings on two circuit substrates (circuit boards).

BACKGROUND OF THE INVENTION

In a metal bonding method as described in JP-2001-185843 (corresponding to U.S. Pat. Nos. 6,598,780, 6,601,754, 6,719,187, 6,769,598), when two metal connectors of wirings on two circuit substrates are bonded, the connectors of the circuit substrates are faced each other while inserting therebetween a hydrocarbon compound having a C—H bond dissociation energy of 950 kJ/mol or less. Then, the connectors are heated to thermally decompose the hydrocarbon compound into a hydrocarbon compound radical from which hydrogen has been separated. The resulting hydrocarbon compound radical reduces and thereby removes an oxide film formed on the metal surface constituting the connector. Different from a method using a flux, the oxide film can be removed without forming metal ion.

Metals from which an oxide film has been removed are melted or diffused by heating and can be bonded. In this case, without deteriorating an insulation performance, sufficient bonding strength can be obtained.

As described above, the reduction reaction of an oxide film formed on a metal surface is caused by a hydrocarbon compound radical. It is therefore necessary to form a sufficient amount of a hydrocarbon compound radical for the removal of the oxide film.

In the above-described method, the hydrocarbon compound radical is formed by heating the connectors, thereby thermally decomposing the hydrocarbon compound. The problem of the above-described method resides in that the connectors must be heated to a relatively high temperature in order to form a sufficient amount of the hydrocarbon compound radical. In this case, a highly heat-resistant material must be used as an insulating material of a circuit substrate having a metal connector mounted thereon. A sufficient bonding strength cannot be attained without increasing the heating temperature to, for example, about 400° C. and continue heating for about 1 to 10 seconds.

SUMMARY OF THE INVENTION

In view of the foregoing problem, it is an object of the present invention to provide a metal bonding method capable of promoting the generation of a hydrocarbon compound radical while maintaining the heating temperature at a low temperature.

First, for the purpose of decreasing the heating temperature, the present inventor investigated whether the selection of a substance having a C—H bond dissociation energy as small as possible enables an increase in a generation amount of a hydrocarbon compound radical while maintaining a low heating temperature. Specifically, as illustrated in FIG. 11, a CH- bond dissociation energy $\Delta H$ is an energy required for separation of a hydrocarbon compound into a hydrocarbon compound radical (R.) and a hydrogen radical (H.). A hydrocarbon compound radical (R.) is readily formed when this C—H bond dissociation energy $\Delta H$ is smaller (refer to the arrow in FIG. 11). The present inventor thought dihydroanthracene may be effective as a substance having a CH bond dissociation energy as small as possible and at the same time having a structure easily stabilized in the form of a hydrocarbon compound radical. Dihydroanthracene has a C—H bond dissociation energy of 894 kJ/mol. The C—H bond dissociation energy was calculated using a molecular orbital calculation soft "WinMOPAC 3.0" while geometry optimization by the PM3 method (which will hereinafter be applied equally to the calculation of a C—H bond dissociation energy).

The bonding state between metal electrodes was studied by placing dihydroanthracene between metal electrodes and heating them to about 300° C., a temperature lower than the conventional one, resulting in failure to attain a satisfactory bonding strength. A bonding area ratio, an indicator for evaluating a bonding strength which will be described later, was only about 15%.

The present inventor has therefore paid attention to a substance which undergoes radical cleavage at a low temperature as a candidate capable of assisting in the radical cleavage of a hydrocarbon compound. According to the idea, when a substance which is cleaved into radicals at a low temperature and abstracts hydrogen from a hydrocarbon compound while it is in the form of a radical is mixed with a hydrocarbon compound, the radical cleavage reaction of the hydrocarbon compound is promoted even at a heating temperature lower than the conventional one.

An organic peroxide and an azo compound are selected as a substance which is cleaved into radicals at a low temperature and abstracts hydrogen from a hydrocarbon compound. It has been confirmed that a hydrocarbon compound mixed with an organic peroxide or azo compound is placed between metal electrodes and heated to about 300° C., the bonding area ratio shows a drastic increase.

According to the present invention, an organic peroxide or azo compound is thermally decomposed by exposure to a heating energy. The organic peroxide is decomposed into an organic peroxide radical whose oxygen-oxygen bond has been released, while the azo compound is decomposed into a radical whose carbon-nitrogen bond has been released. A radical formed from the organic peroxide or azo compound is active and is ready to react with hydrogen. The radical formed from the organic peroxide or azo compound abstracts hydrogen from a hydrocarbon compound, binds with the hydrogen and becomes stable as a hydrogen adduct.

A hydrocarbon compound is, on the other hand, thermally decomposed into a hydrocarbon compound radical. The hydrocarbon compound also becomes a hydrocarbon compound radical, because an organic peroxide radical or a radical formed from an azo compound abstracts hydrogen from the compound. Formation of a hydrocarbon compound radical is thus promoted by an organic peroxide or azo compound so that a sufficient amount of a hydrocarbon compound radical can be formed even at a heating temperature lower than that adopted in the conventional metal bonding method. As a result, an oxide film can be removed from a metal surface even at a decreased heating temperature, which enables a drastic increase in a bonding area ratio, which shows a bonding strength.

BRIEF DESCRIPTION OF THE DRAWINGS

The above and other objects, features and advantages of the present invention will become more apparent from the following detailed description of preferred embodiments made with reference to the accompanying drawings, in which:

FIG. 4 is a graph illustrating the relationship between a C—H bond dissociation energy and a reduction rate constant;

FIG. 5A is a view for explaining a method of confirming a change in the performance of reducing an oxide film by the addition of an organic peroxide to a hydrocarbon compound, and FIG. 5B is a view illustrating the results of FIG. 5A;

FIG. 6 is a view for explaining a bonding method when metal electrodes, which have been formed actually on circuit substrates, respectively, are bonded while inserting therebetween a mixture of a hydrocarbon compound and an organic peroxide and a bonding strength is confirmed;

FIG. 7 is a graph illustrating the relationship between a bonding area ratio, when a mixture of a hydrocarbon compound and an organic peroxide is used, and a 10-hour half-life temperature;

FIG. 8 illustrates the samples which have been prepared by changing an addition amount (weight ratio) of dihydroanthracene as a hydrocarbon compound and methyl ethyl ketone peroxide as an organic peroxide, each within a range of from 0 to 10%, and a bonding area ratio when each sample is used;

DETAILED DESCRIPTION OF THE PREFERRED EMBODIMENT

In this embodiment, a metal bonding method is typically used for a bonding between a metal electrode serving as a connector on a circuit substrate made of an insulating board material such as epoxy resin having glass fibers mixed therein, and a metal electrode on another circuit substrate, a joining terminal of a connector, or a joining terminal of an electronic part. In this embodiment, a bonding example of metal electrodes of two circuit substrates will be described.

Figure 1:
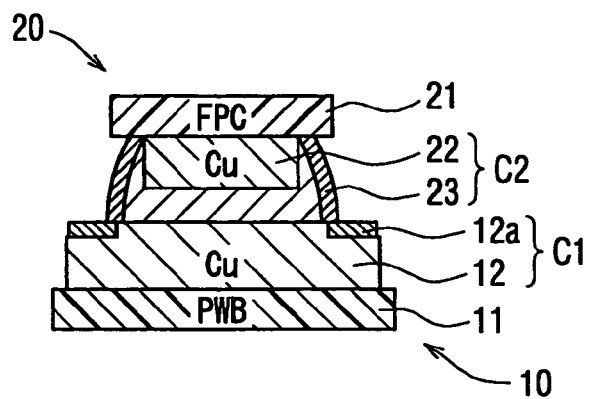
FIG. 1 is a cross-sectional view illustrating a state in which a second circuit substrate is mounted over a first circuit substrate and their wirings are mutually connected, that is, a state after metal electrodes of these substrates are bonded.

FIG. 1 illustrates a state in which a second circuit substrate 20 is mounted over a first circuit substrate 10 and their wirings are mutually connected, that is, a state after metal electrodes of these substrates 10 and 20 are bonded. In this embodiment, a printed wiring board (PWB) is used as the first circuit substrate 10. In this circuit substrate 10, a connector C1 of a metal wiring is formed on the surface of an insulating board 11 and this connector C1 is constituted of a metal electrode 12 made of copper (Cu). A flexible printed circuit (FPC) is used as the circuit substrate 20. In this circuit substrate 20, a connector C2 of a metal wiring is formed on the surface of an insulating board 21. This connector C2 is constituted of a metal electrode 22 made of copper (Cu) and a solder 23 adhered to the metal electrode 22.

In this embodiment, the connectors C1 and C2 of the wirings on the first and second circuit substrates 10 include the metal electrodes 12 and 22, respectively and at least one of them further includes a solder placed on the metal electrode. As the solder 23, a lead-free solder composed mainly of silver (Ag) and tin (Sn) is used.

As illustrated in FIG. 1, the connector C1 on the first circuit substrate 10 and the connector C2 on the second circuit substrate 20 are soldered. In other words, the metal electrode 12 on the first circuit substrate 10 and the solder-coated metal electrode 22 on the circuit substrate 20 are bonded.

Next, the bonding process of the first circuit substrate 10 and the second circuit substrate 20 as illustrated in FIG. 1 will be described referring to FIGS. 2 and 3. First, the first circuit substrate 10 and the second circuit substrate 20 are prepared. At this time, the surface of the connector C1 of the metal wiring on the first circuit substrate 10 has an oxide film 12a formed thereon due to air oxidation, while the surface of the solder 23 at the connector C2 of the metal wiring on the second circuit substrate 20 has an oxide film formed thereon due to air oxidation.

A hydrocarbon compound 30 mixed with an organic peroxide and having a C—H bond dissociation energy of from 850 to 950 kJ/mol is applied onto the connector C1 on the first circuit substrate 10. The organic peroxide and hydrocarbon compound are added and mixed in a solvent such as trimethylbenzene. They are then applied onto the connector C1 in the form imparted with fluidity by the solvent. This solvent however evaporates until the bonding of the connectors C1 and C2 is started and after that, only the mixture of the hydrocarbon compound and the organic peroxide remains between the connectors C1 and C2.

Figure 2:
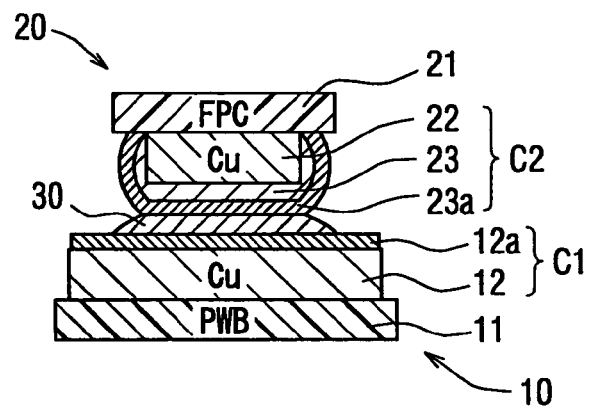
FIG. 2 is a cross-sectional view for explaining a bonding process of the first circuit substrate and the second circuit substrate.

As illustrated in FIG. 2, the second circuit substrate 20 is laid over the first circuit substrate 10 such that connectors C1 and C2 of the metal wirings face each other. Accordingly, the mixture of the hydrocarbon compound 30 and the organic peroxide is interposed between the metal constituting the connector C1 of the wiring on the first circuit substrate 10 and the metal constituting the connector C2 of the wiring on the second circuit substrate 20, and the connectors C1 and C2 on both the substrates are disposed opposite to each other.

Examples of the hydrocarbon compound having a C—H bond dissociation energy of from 850 to 950 kJ/mol include, as shown in FIG. 4, cyclooctane, tetramethylpentadecane, triphenylmethane, dicyclopentadiene, and dihydroanthracene. The hydrocarbon compound 30 containing at least one of these substances is therefore used.

Examples of the organic peroxide to be mixed with the hydrocarbon compound 30 include compound containing at least one of t-butylcumyl peroxide, t-butyl peroxybenzoate, t-butylperoxyisopropyl monocarbonate, 1,1-di(t-hexylperoxy)cyclohexane and methylethylketone peroxide. The reason why these substances are selected as the organic peroxide will be described later.

The connectors C1 and C2 of the metal wirings on the substrates 10 and 20 are then heated to the melting point of the solder 23 or greater while applying pressure between the connectors. The pressure applied at this time is, for example, from 0.3 to 2.0 MPa. Heating temperature is 300° C. and heating and pressure application are performed for from 1 to 10 seconds.

Figure 3:
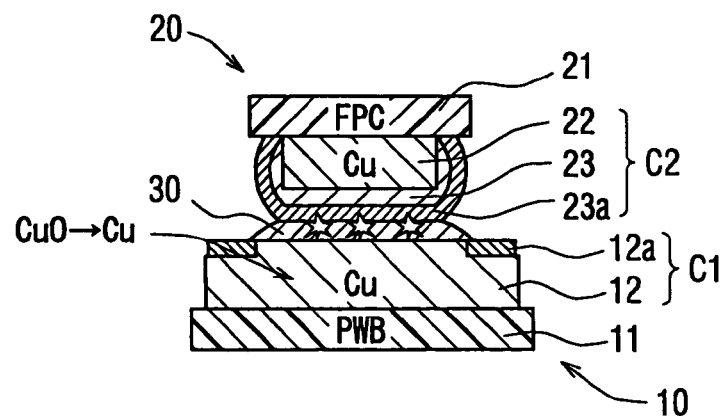
FIG. 3 is a cross-sectional view for explaining the bonding process of the first circuit substrate and the second circuit substrate.

At this time, as illustrated in FIG. 3, by heating the mixture of the hydrocarbon compound 30 and the organic peroxide, the hydrocarbon compound 30 is thermally decomposed into a hydrocarbon compound radical from which hydrogen has been separated. The organic oxide is also thermally decomposed into an organic peroxide radical whose oxygen-oxygen bond has been released. This organic peroxide radical abstracts hydrogen from the hydrocarbon compound, which promotes the formation of a hydrocarbon compound radical.

A sufficient amount of a hydrocarbon compound radical is formed even at a low heating temperature (about 300° C.) so that the metal electrodes 12 and 22 constituting the connectors C1 and C2 on both boards are bonded by the melting of a metal (solder) while the oxide films 12a and 23a formed on the metal surfaces are reduced. In other words, the oxide films 12a and 23a are removed owing to reduction thereof, and a clean metal surface is exposed and wetness is improved. Under such a state, the surface of the metal electrode 12 is brought into contact with the surface of the solder 23 on the substrate 20. Moreover, as illustrated in FIG. 1, accompanied by the melting of the solder 23, the solder 23 on the substrate 20 and the metal electrode 12 on the substrate 10 are bonded.

By the use of the mixture of the hydrocarbon compound 30 and the organic peroxide, a sufficient amount of a hydrocarbon compound radical can be generated even at a relatively low heating temperature (about 300° C.). Owing to the reduction action of the hydrocarbon compound radical, an oxide film can be removed and metals can be bonded well. By such a decrease in the heating temperature, materials used for the insulating boards 11 and 21 of the first and second circuit substrates are not necessarily limited to those having high heat resistance, which leads to wide choice of materials.

The hydrocarbon compound 30 and organic peroxide used in this Embodiment will next be described. As the hydrocarbon compound 30, that having a C—H bond dissociation energy of from 890 to 950 kJ/mol is used because of the below-described reason.

The present inventor searched the relationship between a C—H bond dissociation energy and a reduction rate constant of each hydrocarbon compound. The results are shown in FIG. 4. The term "reduction rate constant" as used herein means that determined by assaying (in the reduced form) an amount of oxygen on a copper surface by wavelength dispersion X-ray spectroscopy when a board (having a copper terminal already oxidized) put in a hydrocarbon compound solution is heated at 300° C. for a predetermined time, and then calculating in accordance with the following equation.

Reduction rate constant $k=(1-X/X1)/(t \cdot X)$ wherein, X1: X ray count when the copper surface is in an oxidation state X: X ray count after heating for a predetermined time T: heating time (seconds)

As a result, as illustrated in FIG. 4, it has been confirmed that the reduction rate increases with a decrease in the C—H bond dissociation energy. In other words, it has been confirmed that there is a correlation between a CH-bond dissociation energy and an oxide film removing capacity.

With various substances having a relatively small C—H bond dissociation energy, a copper electrode and a solder coated copper electrode were then bonded. As a result, it has been confirmed that when a hydrocarbon compound having a C—H bond dissociation energy ΔH not greater than 950 kJ/mol is used, a bonding area ratio is as high as 70% or greater which is on the same level as the conventional flux and sufficient bond strength can be attained (the smaller the C—H bond dissociation energy, the better the bonding property). This heating is performed at 400° C. for 9 seconds.

More specifically, eicosane having a C—H bond dissociation energy ΔH exceeding 950 kJ/mol has a bonding surface area ratio of only about 40% or so, while cyclooctene and tetramethylpentadecane having a C—H bond dissociation energy ΔH not greater than 950 kJ/mol each has a bonding area ratio as high as 70% or greater. This reveals that a hydrocarbon compound having a C—H bond dissociation energy ΔH not greater than 950 kJ/mol has a sufficient reduction capacity of an oxide film.

The term "bonding area ratio" as used herein means a ratio, which is determined by making (assuming) a square observation window by using the short side of a rectangular bonding site, bring this window to the area most inferior in bonding in the rectangular bonding site, and determining a ratio of an actually bonded area relative to the whole area inside of this window.

When the C—H bond dissociation energy is excessively small, the hydrocarbon compound radical becomes unstable. Unstable existence of the hydrocarbon compound may lead to the possibility of lowering in a reduction efficiency of an oxide film. From such a standpoint, use of a substance having a C—H bond dissociation energy of 890 kJ/mol or greater is preferred in order to stabilize the hydrocarbon compound radical.

A description will next be made of various tests for verifying the effect of mixing of an organic peroxide with a hydrocarbon compound and at the same time, specific substances preferably used as an organic peroxide.

(1) Only a hydrocarbon compound solution, (2) a hydrocarbon compound solution having copper oxide charged therein, and (3) a solution of a mixture of a hydrocarbon compound and an organic peroxide having copper oxide charged therein were each poured in a vessel as illustrated in FIG. 5A. They were heated at 300° C. for a predetermined time. The formation amount of a hydrocarbon oxide was assayed after heating. The hydrocarbon compound used for this test was methyl ethyl ketone peroxide, while the solvent was trimethylbenzene.

As a result, as illustrated in FIG. 5B, the formation amount of the hydrocarbon oxide in the vessel containing only the hydrocarbon compound solution was 4.57%, that in the vessel containing the hydrocarbon compound solution having copper oxide charged therein was 5.24% and that in the vessel containing the solution of a mixture with an organic peroxide having copper oxide charged therein was 5.63%, each based on the original amount of the hydrocarbon compound. These results show that addition of an organic peroxide increases the formation amount of a hydrocarbon oxide, in other words, improves the performance of a hydrocarbon compound to reduce a copper oxide.

A mixture of a hydrocarbon compound and an organic peroxide was then prepared. With the resulting mixture, metal electrodes formed on circuit substrates were bonded actually and its bonding strength was studied. Described specifically, as illustrated in FIG. 6, a copper electrode 110 formed on a circuit substrate 100 using a glass-cloth-containing epoxy resin as a board material, and a SnAg solder 220 applied to a copper wiring 210 formed on a flexible circuit substrate 200 using a flexible resin as a board material were bonded by heating under pressure while interposing therebetween the mixture of a hydrocarbon compound and an organic peroxide.

During this bonding, the copper electrode on the circuit substrate 100 was heated at 240° C. for 1 minute to form an oxide film on the electrode. The portions of these substrates 100 and 200 to be bonded were heated under pressure by using a heating tool 300. The heating temperature and heating time were set at 300° C. and 1 second, respectively.

In this test, dihydroanthracene was used as the hydrocarbon compound. Trimethylbenzene (80 wt. %) as a solvent, 10 wt. % of dihydroanthracene and 10 wt. % of an organic peroxide were mixed and the resulting mixture was applied to the copper electrode 100 on the circuit substrate 100.

The results of the test are shown in the graph of FIG. 7. This graph also includes, for comparison, the results of the tests using a hydrocarbon compound (dihydroanthracene) alone and a flux. As illustrated in FIG. 7, when only the hydrocarbon compound (dihydroanthracene) was used, a bonding area ratio was from 10 to 18%, but after mixed with an organic peroxide, a bonding area ratio shows an increase. More specifically, addition of t-butylcumyl peroxide improves a bonding area ratio, though slightly. Addition of t-butylperoxyisopropyl monocarbonate or 1,1-di(t-hexylperoxy)cyclohexane improves a bonding area ratio to from 20 to 30%. Addition of t-butylperoxybenzoate or methyl ethyl ketone peroxide improves a bonding area ratio to from 70% to 80% or greater, which is almost as high as that of the flux.

With regards to methyl ethyl ketone peroxide which contributes to a marked improvement in a bonding area ratio, an influence of a mixing ratio on a bonding area ratio was studied. More specifically, as illustrated in FIG. 8, six samples were prepared by changing, within a range of from 0 to 10%, a weight ratio of dihydroanthracene mixed as the hydrocarbon compound or a weight ratio of methyl ethyl ketone peroxide mixed as the organic peroxide and their bonding area ratio was studied. In this test, an oxide film was formed on a copper electrode on the circuit substrate 100 by heating at 240° C. for 30 seconds and then allowing it to stand for 6 days.

As a result of the test, when dihydroanthracene was used alone, a bonding area ratio was about 15% irrespective of a change in its weight ratio (1 wt. %, 5 wt. %). When 5 wt. % of dihydroanthracene and 5 wt. % of methyl ethyl ketone peroxide were mixed, a bonding area ratio increased even to 70%. When 5 wt. % of dihydroanthracene was mixed with 10 wt. % of methyl ethyl ketone peroxide, the bonding area ratio increased to 90%. A mixture of 10 wt. % of dihydroanthracene and 10 wt. % of methyl ethyl ketone peroxide showed the highest bonding area ratio. When only methyl ethyl ketone peroxide was applied without dihydroanthracene, the bonding area ratio was 15%.

The above tests have revealed that a sufficient improvement in the bonding property can be attained by mixing a hydrocarbon compound and an organic peroxide, each in a certain amount (about 10 wt. %), in a solvent.

As described above, mixture (addition) of an organic peroxide in a hydrocarbon compound brings about an improvement in the bonding property of metal electrodes. The present inventor made a study as described below in order to find a preferable organic peroxide to be mixed in a hydrocarbon compound.

As illustrated in FIG. 7, the 10-hour half-life temperature of each organic peroxide was studied. The term "10-hour half-life temperature" as used herein means a temperature at which an organic peroxide decomposes and therefore decreases by half after 10 hours. It is an indicator of ease of decomposition of the organic peroxide. As can be seen from FIG. 7, however, no correlation exists between an improvement in the bonding property and 10-hour half-life temperature.

Figure 9:
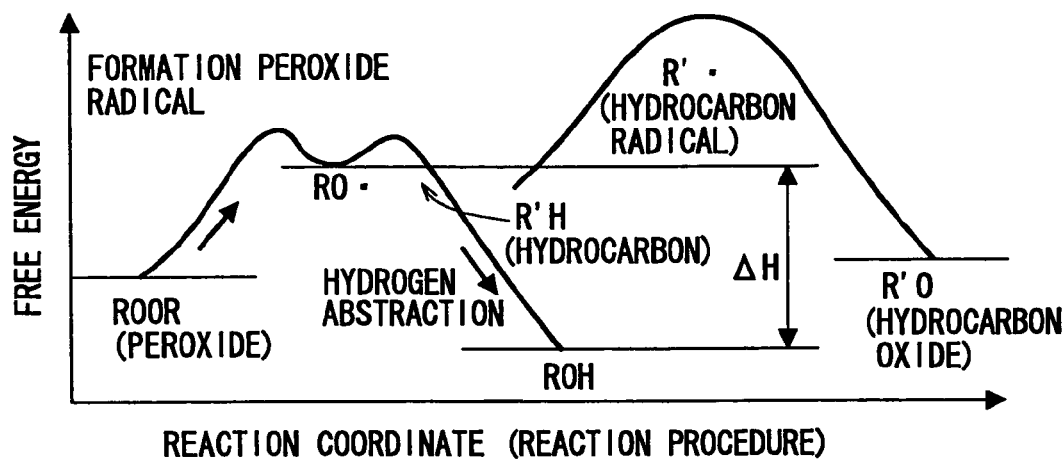
FIG. 9 is a view for explaining the reduction reaction of an oxide film by a hydrocarbon compound when it is mixed with an organic peroxide.

A reduction reaction of an oxide film caused by a hydrocarbon compound when it was mixed with an organic peroxide was then analyzed. In this reduction reaction, an organic peroxide (ROOR) is thermally decomposed into an organic peroxide radical (RO.) as illustrated in FIG. 9. This organic peroxide radical is active so that it abstracts hydrogen from a hydrocarbon compound (RH) and is stabilized as a hydrogen adduct (ROH). The hydrocarbon compound (RH), on the other hand, becomes a hydrocarbon compound radical (R.) by the abstraction of hydrogen by the organic peroxide radical (RO.). This hydrocarbon compound radical (R.) abstracts oxygen from an oxide film, thereby reducing the oxide film and is stabilized as a hydrocarbon oxide.

The present inventor paid attention to the hydrogen abstraction reaction, in such a reduction reaction, by an organic peroxide radical (RO.). The smaller a difference between an energy in the form of an organic peroxide radical (RO.) and an energy in the form of a hydrogen adduct (ROH) after abstraction of hydrogen from the hydrocarbon compound, the organic peroxide radical (RO.) is able to exist more stably. The present inventor presumed that stable existence of the organic peroxide radical (RO.) accelerates a hydrogen abstraction reaction and moreover, a reduction reaction of an oxide film.

Figure 10:
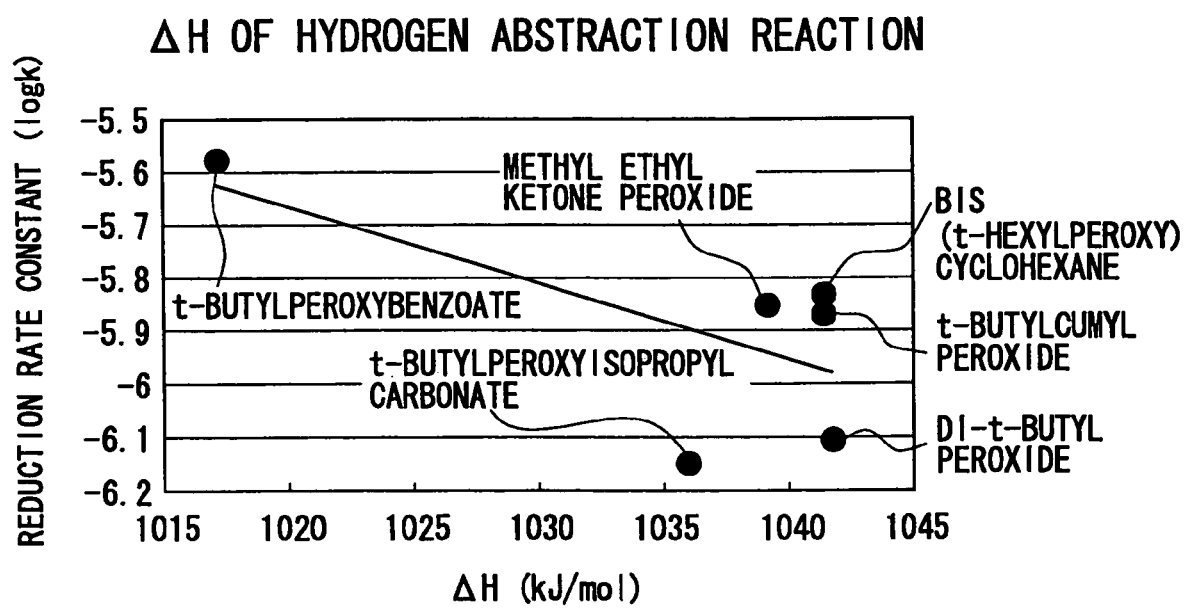
FIG. 10 is a graph illustrating the relationship between a reduction rate constant logK and a difference ΔH in energy of each organic peroxide between in the form of an organic peroxide radical (R.) and in the form of a hydrogen adduct (ROH) obtained by bonding of the organic peroxide radical (R.) with hydrogen abstracted from a hydrocarbon compound (RH)
Figure 11:
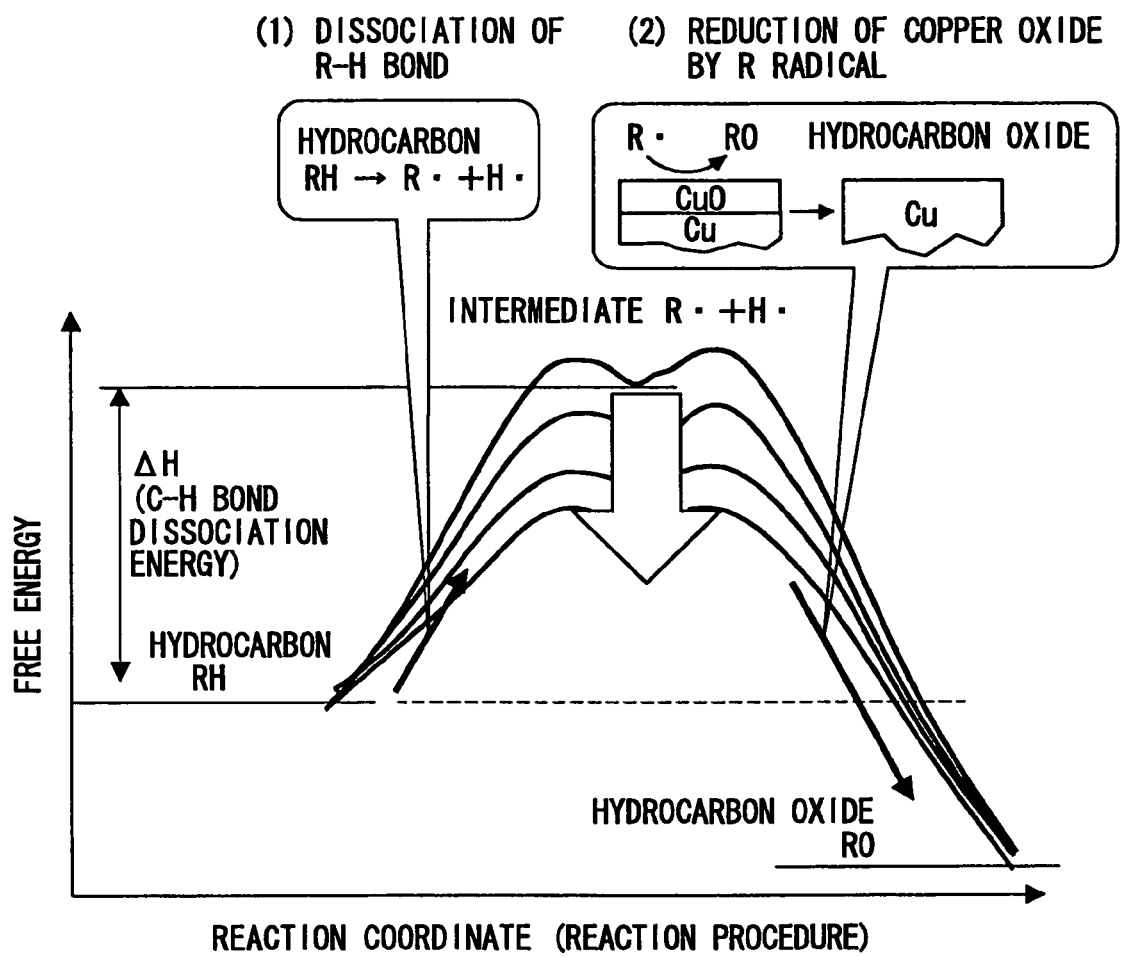
FIG. 11 is a view for explaining the C—H bond dissociation energy ΔH of a hydrocarbon compound.

The present inventor therefore determined a difference $\Delta H$ between an energy in the form of an organic peroxide radical (RO.) and an energy in the form of a hydrogen adduct (ROH) obtained by bonding of the organic peroxide radical (RO.) to hydrogen abstracted from the hydrocarbon compound (RH). The relationship between the resulting energy difference and a reduction rate constant logK determined in the above-described manner is shown in the graph of FIG. 10. As illustrated in FIG. 10, a correlation exists between a difference $\Delta H$ in the energy before and after the hydrogen abstraction reaction and a reduction rate constant logK. As the difference $\Delta H$ in the energy before and after the hydrogen abstraction reaction becomes smaller, a reduction rate constant logK increases, which improves the removing capacity of an oxide film.

In the graph of FIG. 10, the organic peroxide showing the lowest reduction rate constant is t-butylperoxyisopropyl monoarbonate. As described above, however, even mixture (addition) of it to the hydrocarbon compound brings about improvement in the bonding area ratio between metal electrodes. This suggests that an organic peroxide having an energy difference $\Delta H$, before and after hydrogen abstraction reaction, within a range of from 1015 to 1045 kJ/mol is able to promote the reduction reaction of the hydrocarbon compound.

Preferred embodiments of the present invention were so far described. The present invention is however not limited to or by them. It can be modified within an extent not departing from the gist of the present invention.

In the above-described embodiment, a using example of an organic peroxide as a substance for promoting the formation of a hydrocarbon compound radical was described. As a substance for promoting the formation of a hydrocarbon compound radical, not only the organic peroxide, but also an azo compound can be used.

An azo compound is an organic compound (R—N=N—R') having an azo group (—N=N—) bound with a carbon atom of a hydrocarbon group. Similar to the organic peroxide, this azo compound is also decomposed by heating. It is decomposed into a radical whose carbon-nitrogen bond (C—N) has been released. For example, when azobisisobutyronitrile ($C_8H_{12}N_4$) is heated, its carbon-nitrogen bond is decomposed to release nitrogen ($N^2$), whereby a radical ($2(CH_3)_2C$—$C\equiv N \Leftrightarrow 2(CH_3)_2$—$C\equiv N$.) is formed. The resulting radical is active so that it abstracts hydrogen from a hydrocarbon compound (RH) and is stabilized as a compound bound with the hydrogen ($2(CH_3)_2C$—$C\equiv N$).

The radical formed from the azo compound abstracts hydrogen from the hydrocarbon compound (RH), whereby the formation of a hydrocarbon compound radical (R.) is promoted. A sufficient amount of the hydrocarbon compound radical (R.) can therefore be formed even at a temperature lower than that employed in the conventional metal bonding method. As a result, an oxide film can be removed from a metal surface even if the heating temperature is reduced to about 300° C.

How much the use of azobisisobutyronitrile as an azo compound contributes to improvement of a bonding area ratio between metal electrodes was studied. As a result, as illustrated on the right side of the graph in FIG. 7, it improves a bonding area ratio to from 60 to 80% or greater. It has therefore been confirmed that even mixture (addition) of an azo compound in a hydrocarbon compound improves the performance of the hydrocarbon compound to reduce an oxide film. The test conditions employed for this study are similar to those employed for the confirmation of a bonding strength of metal electrodes by using a mixture of a hydrocarbon compound and an organic peroxide.

According to this embodiment, a metal bonding method for bonding a first connector (e.g., metal electrode 12) and a second connector (e.g., metal electrode 22) includes a step of facing the first connector and second connector to each other while inserting therebetween a mixture of a hydrocarbon compound and an organic peroxide, and a step of heating the mixture of the hydrocarbon compound and the organic peroxide to thermally decompose the hydrocarbon compound into a hydrocarbon compound radical from which hydrogen has been separated and to thermally decompose the organic peroxide into an organic peroxide radical whose oxygen-oxygen bond has been released. During the heating step, abstracting of hydrogen from the hydrocarbon compound is performed using the organic peroxide radical, thereby promoting the formation of the hydrocarbon compound radical. Further, a bonding of the metals constituting the connectors is performed through contact, diffusion or melting of the metals while reducing an oxide film formed on the surface of the metal by the hydrocarbon compound radical.

Alternatively, a metal bonding method includes a step of facing the first connector and second connector to each other while inserting therebetween a mixture of a hydrocarbon compound and an azo compound, and a step of heating the mixture of the hydrocarbon compound and the azo compound to thermally decompose the hydrocarbon compound into a hydrocarbon compound radical from which hydrogen has been separated and to thermally decompose the azo compound into an azo compound radical whose carbon-nitrogen bond has been released. In the heating, abstracting of hydrogen from the hydrocarbon compound is performed using the azo compound radical, thereby promoting the formation of the hydrocarbon compound radical. Furthermore, bonding of the metals constituting the connectors is performed through contact, diffusion or melting of the metals while reducing an oxide film formed on the surface of the metal by the hydrocarbon compound radical. As an example, the azo compound is azobisisobutyronitrile.

The organic peroxide or the azo compound is exposed to a heating energy and thermally decomposed into an organic peroxide radical or the azo compound radical. Since the radical is active, it abstracts hydrogen from the hydrocarbon compound. The formation of a hydrocarbon compound radical is accelerated so that even at a relatively low heating temperature, a sufficient amount of a hydrocarbon compound radical can be formed. As a result, an oxide film can be removed from the metal surface even at a relatively low heating temperature equal to or lower than 300° C. by the reduction caused by the hydrocarbon compound radical.

For example, a difference between an energy in the form of an organic peroxide radical and an energy in the form of a hydrogen adduct obtained by bonding of the organic peroxide radical with hydrogen abstracted from the hydrocarbon compound, is within a range of from 1015 to 1045 kJ/mol. Furthermore, the organic peroxide can contain at least one of t-butylcumyl peroxide, t-butylperoxybenzoate, t-butylperoxyisopropyl monocarbonate, 1,1-di(t-hexylperoxy)cyclohexane, and methyl ethyl ketone peroxide.

Further, the hydrocarbon compound can have a C—H bond dissociation energy of from 890 to 950 kJ/mol. Furthermore, the hydrocarbon compound may contain at least one of cyclooctane, tetramethylpentadecane, triphenylmethane, dicylopentadiene and dihydroanthracene.

At least one of the metal electrodes have a solder applied thereto. In this case, the bonding of the metal electrodes 12, 22 can be performed by heating the hydrocarbon compound at a temperature not lower than the melting point of the solder to reduce the oxide film on the surface of the solder and the metal electrode by the hydrocarbon compound radical.

Although the present invention has been described in connection with some preferred embodiments thereof with reference to the accompanying drawings, it is to be noted that various changes and modifications will become apparent to those skilled in the art.

In the above embodiment, a bonding between a copper electrode and a solder coated copper electrode via a solder is performed. Alternately, metals constituting the electrodes may be bonded by mutual diffusion caused by a mixture of a hydrocarbon compound and an organic peroxide or azo compound.

For example, one of the electrodes is constituted by a metal electrode made of copper (Cu), a nickel (Ni) film adhered thereto and a gold (Au)-plated film formed on the nickel film, while the other electrode is constituted by a metal electrode made of copper (Cu) and a tin (Sn) film adhered to the surface thereof.

The mixture of a hydrocarbon compound and an organic peroxide or azo compound is applied to at least one of the electrodes and then the metal electrodes are overlapped one after another, followed by heating under pressure. They are heated to a temperature not greater than the melting point of a metal, of the metal (Au) of one electrode and the metal (Sn) of the other electrode, having a lower melting point, Sn in this case. More specifically, they are heated at from 180 to 200° C., that is, a temperature not greater than the melting point (232° C.) of tin. Pressurization is performed, for example, within a range of from 0.3 to 2.0 MPa. The heating and pressurization time is from 1 to 10 seconds.

In this case, since the formation of a hydrocarbon compound radical is promoted as described above, an oxide film formed on the each metal surface can be reduced and thereby removed. As a result, metal surfaces overlapped with their surface being cleaned can be heated and pressurized so that metals constituting both electrodes can be bonded by the diffusion of these metals.

This metal bonding method is also applicable to the bonding of terminals while bringing them in contact (pressure welding), thereby maintaining electrical conduction. A mixture of a hydrocarbon compound and an organic peroxide or azo compound is applied to the surface of at least one connection terminal and two terminals are heated while bringing them in contact. This makes it possible to reduce the oxide film on the contact surface between these connection terminals, whereby a connection resistance between these bonding terminals can be reduced.

While the invention has been described with reference to preferred embodiments thereof, it is to be understood that the invention is not limited to the preferred embodiments and constructions. The invention is intended to cover various modification and equivalent arrangements. In addition, while the various elements of the preferred embodiments are shown in various combinations and configurations, which are preferred, other combinations and configuration, including more, less or only a single element, are also within the spirit and scope of the invention.

What is claimed is:

1. A metal bonding method for bonding a first connector and a second connector, each of which is made of a metal, the method comprising:
   facing the first connector and second connector to each other while inserting therebetween a mixture of a hydrocarbon compound and an organic peroxide;
   heating the mixture of the hydrocarbon compound and the organic peroxide to thermally decompose the hydrocarbon compound into a hydrocarbon compound radical from which hydrogen has been separated and to thermally decompose the organic peroxide into an organic peroxide radical whose oxygen-oxygen bond has been released, wherein abstracting hydrogen from the hydrocarbon compound is performed using the organic peroxide radical, thereby promoting the formation of the hydrocarbon compound radical; and
   bonding the metals constituting the connectors through contact, diffusion or melting of the metals while reducing an oxide film formed on the surface of the metal by the hydrocarbon compound radical.

2. A metal bonding method according to claim 1, wherein a difference between an energy in the form of an organic peroxide radical and an energy in the form of a hydrogen adduct obtained by bonding of the organic peroxide radical with hydrogen abstracted from the hydrocarbon compound, is within a range of from 1015 to 1045 kJ/mol.

3. A metal bonding method according to claim 1, wherein the organic peroxide contains at least one of t-butylcumyl peroxide, t-butylperoxybenzoate, t-butylperoxyisopropyl monocarbonate, 1,1-di(t-hexylperoxy)cyclohexane, and methyl ethyl ketone peroxide.

4. A metal bonding method according to claim 1, wherein at least one of the first connector and the second connector is a connection electrode of a wiring formed on an insulating board.

5. A metal bonding method according to claim 1, wherein:
   the first and second connectors are metal electrodes, respectively; and
   when the hydrocarbon compound is interposed between the metal electrodes, the bonding of the metal electrodes is performed by heating the hydrocarbon compound at a temperature not greater than a melting point of the metal electrodes while pressurizing the metal electrodes to cause diffusion.

6. A metal bonding method according to claim 1, wherein:
   the first and second connectors are metal electrodes, respectively;
   at least one of the metal electrodes have a solder applied thereto; and
   the bonding of the metal electrodes are performed by heating the hydrocarbon compound at a temperature not lower than the melting point of the solder to reduce the oxide film on the surface of the solder and the metal electrode by the hydrocarbon compound radical.

7. A metal bonding method according to claim 6, wherein at least one of the metal electrodes is made of copper.

8. A metal bonding method according to claim 1, wherein the hydrocarbon compound has a C—H bond dissociation energy of from 890 to 950 kJ/mol.

9. A metal bonding method according to claim 8, wherein the hydrocarbon compound contains at least one of cyclooctane, tetramethylpentadecane, triphenylmethane, dicylopentadiene and dihydroanthracene.

10. A metal bonding method according to claim 1, wherein the heating is performed at a temperature of about 300° C.

11. A metal bonding method according to claim 1, wherein the heating is performed at a temperature equal to or lower than 300° C.

* * * * *